United States Patent
Brown

[11] Patent Number: 5,993,148
[45] Date of Patent: Nov. 30, 1999

[54] ARTICLE TRANSFER METHODS

[75] Inventor: Paul D. Brown, Boise, Id.

[73] Assignee: Micron Technology, Inc., Boise, Id.

[21] Appl. No.: 08/903,222

[22] Filed: Jul. 22, 1997

[51] Int. Cl.[6] .................................................. B65G 65/04
[52] U.S. Cl. ........................ 414/810; 414/405; 414/761;
414/421; 414/719
[58] Field of Search ..................... 414/763, 773,
414/719, 419, 421, 810, 405; 269/43, 900,
902

[56] References Cited

U.S. PATENT DOCUMENTS

| | | | |
|---|---|---|---|
| 3,949,891 | 4/1976 | Butler et al. | 414/405 |
| 4,431,361 | 2/1984 | Bayne | 414/405 |
| 4,728,246 | 3/1988 | Mello . | |
| 4,743,156 | 5/1988 | Raffay et al. | 414/405 |
| 4,770,590 | 9/1988 | Hugues et al. . | |
| 4,778,332 | 10/1988 | Byers et al. . | |
| 4,830,564 | 5/1989 | Walker et al. | 414/405 |
| 4,850,381 | 7/1989 | Moe et al. . | |
| 4,973,217 | 11/1990 | Engelbrecht . | |
| 5,085,557 | 2/1992 | Koltookian | 414/719 X |
| 5,168,886 | 12/1992 | Thompson et al. . | |
| 5,169,192 | 12/1992 | Allison et al. . | |
| 5,177,514 | 1/1993 | Ushijima et al. . | |
| 5,193,969 | 3/1993 | Rush et al. . | |
| 5,217,273 | 6/1993 | Hendricsen et al. . | |
| 5,226,758 | 7/1993 | Tanaka et al. . | |
| 5,253,663 | 10/1993 | Tanaka et al. . | |
| 5,299,901 | 4/1994 | Takayama . | |
| 5,360,309 | 11/1994 | Ishiguro | 414/405 X |
| 5,409,348 | 4/1995 | Suzuki . | |
| 5,498,294 | 3/1996 | Matsushita et al. . | |
| 5,507,614 | 4/1996 | Leonov et al. . | |

FOREIGN PATENT DOCUMENTS

| | | | |
|---|---|---|---|
| 29035 | 9/1957 | Finland | 414/773 |
| 1324973 | 7/1987 | U.S.S.R. | 414/405 |

OTHER PUBLICATIONS

H–Square Corporation, Horizontal Wafer Transfer Machines, Catalog pp. 8–1 to 8–4.

Primary Examiner—Frank E. Werner
Attorney, Agent, or Firm—Kirkpatrick & Lockhart LLP

[57] ABSTRACT

Apparatuses and methods are disclosed for transferring ordered articles between carriers. Generally, an empty partitioned carrier is aligned in a generally opposing relationship with partitions in a carrier containing at least one article to be transferred to the empty carriers. The carriers are aligned to perform the transfer of the articles, while maintaining the relative order, or arrangement, of the articles in the carrier. The aligned carriers are then rotated through a gravitational field to exert a sufficient force to transfer the articles between the carriers. An apparatus of the present invention for transferring articles preferably includes a fulcrum and a lever arm having a transfer end. The lever arm is attached to the fulcrum to allow the lever arm to be rotated about the fulcrum. The transfer end includes a clamp having first and second adjacent carrier retaining portions configured to retain two carriers in an opposing relationship to allow for the transfer of articles between the carriers.

19 Claims, 13 Drawing Sheets

ARTICLE TRANSFER METHODS

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present invention is directed generally to the bulk transfer of articles between containers and, more particularly, to the bulk transfer of ordered articles, namely, semiconductor wafers, between partitioned carriers.

BACKGROUND OF THE INVENTION

Integrated circuits are solid state devices in which electrical components and electrical connections between the components are incorporated into a solid matrix. The electrical components and connections are produced by the strategic placement of various conducting, semiconducting and insulating materials to form and encapsulate the desired circuit in the composite solid matrix. The development of the integrated circuit has led to the miniaturization of electronics by providing a strong matrix to support and protect fragile miniaturized components and connections and by facilitating the placement of the electrical components in close proximity. The integrated circuit has further served to increase the reliability of electronic devices by the elimination of moving parts and fragile electrical wiring and connections.

Integrated circuits are typically mass produced by forming hundreds of circuits, called dice, on a semiconductor substrate, or "wafer". The circuits are formed by depositing a series of individual layers of predetermined materials on the wafer. The individual layers of the integrated circuit are, in turn, produced by a series of manufacturing steps. The precise characteristics of the layers, such as composition, thickness, and surface quality, uniquely determine the electronic properties and the performance of the integrated circuit.

The integrated circuits must be produced in a clean environment to prevent contamination of the layers by foreign matter that will degrade the performance of circuits. Contamination level requirements in semiconductor wafer processing areas ("clean rooms") are typically less than 1 particle/ft$^3$ air (referred to as Class 1 cleanliness). To achieve these requirements, special high volume ventilation systems are necessary to continually filter the surrounding air. The ventilation systems represent a significant contribution to the overall wafer production cost. Therefore, a significant savings can be realized by minimizing the size of the clean room, and thereby lessening the costs associated with operating the clean room.

In addition, the production of integrated circuits subjects the semiconductor wafers to a number of different processes and environmental conditions. Wafer carriers are used to store, transport, and track the wafers in bulk lots through and between the various processes. However, a single carrier is not typically suitable for exposure to all of the different environmental conditions encountered during processing. Therefore, the wafers must be transferred to more suitable carriers at various stages of processing.

Wafer transfer machines are typically used to transfer the wafers between carriers and/or boats. The machines generally include a base upon which a first carrier containing the wafers and a second empty carrier are placed in fixed opposing positions. A transfer arm is either manually or automatically translated to contact and push the wafers from the first carrier to the second carrier.

One problem with the wafer transfer machines currently used in industry is that the machines are generally capable of transferring only one size wafer or are designed for only one type of carrier or boat. As a result, a different machine must be acquired and placed in the clean room for each wafer size to be processed or each boat type used. The additional machines unnecessarily adds to the overall wafer production costs in terms of increased equipment and maintenance costs and increased clean room space requirements to house the equipment.

Another problem with current wafer transfer machines is that the surface or face of the wafers must be perpendicular to gravity to allow the wafers to be moved between carriers. Wafers are normally stored and transported in the carriers with the surface or face aligned generally parallel to the gravitational field. The additional handling of the carriers necessary to transfer the wafers in this manner increases the potential for damage to the wafers. The additional handling may also be awkward for personnel and could result in injuries.

Yet another problem with current wafer carrier machines is that wafer carriers must be constructed to allow access by the transfer arm to push the wafers between carriers. Therefore, the shape of the carrier cannot be optimized for the specific process in which the carrier is used.

In view of these and other problems, there is generally a need for improved article transfer apparatuses and methods. Specifically, there is a need for article transfer machines that can be used to perform wafer transfer operations for different size wafers and carriers with more ergonomically conducive, but less overall, handling, thereby reducing associated equipment and clean room costs and injuries to personnel.

BRIEF SUMMARY OF THE INVENTION

The above objectives and others are accomplished by methods and apparatuses in accordance with the present invention. The transfer of articles is generally performed by aligning a carrier containing at least one article to be transferred in an opposing relationship with an empty carrier. The aligned carriers are rotated through a gravitational field to transfer the articles between the carriers.

An apparatus for transferring articles preferably includes a fulcrum and a lever arm having a transfer end. The lever arm is attached to the fulcrum to allow the lever arm to be rotated about the fulcrum. The transfer end includes a clamp having first and second adjacent carrier retaining portions configured to retain two carriers in an opposing relationship that allows for the transfer of articles between the carriers. In a preferred embodiment, the lever arm further includes a balance end and the lever arm is attached to the fulcrum between the balance end and the transfer end. Also in a preferred embodiment, horizontal and vertical adjustments are included to accommodate carriers having different sizes. In a current preferred embodiment, the transfer machine is manually operated to transfer wafers between two carriers; however, the machine can be automated, and also suitably modified to transfer wafers between a plurality of pairs of carriers.

In an alternative embodiment, the apparatus includes a positioning device used to position a rotating member and a clamp attached thereto in a transfer position. The carriers having previously been attached to the clamp are rotated, preferably about a central axis passing through the carriers, to transfer the ordered articles between the carriers. In one embodiment of the invention, the positioning device includes two translatable lifts positioned on opposing sides of the carriers. The rotating member is rotatably disposed between the lifts. In another embodiment, the positioning device includes a lever arm and fulcrum that are used to rotate the rotating member to the transfer position.

The apparatuses and methods of the present invention provide increased versatility in transferring articles and lessen the handling of the carriers required to bring about the transfer. Accordingly, the present invention overcomes the aforementioned problems and provides apparatuses and methods for effectively and efficiently transferring articles in bulk between carriers. These advantages and others will become apparent from the following detailed description.

BRIEF DESCRIPTION OF THE DRAWINGS

Preferred embodiments of the invention will now be described, by way of example only, with reference to the accompanying Figures wherein like members bear like reference numerals and wherein.

DETAILED DESCRIPTION OF THE INVENTION

Figure 1:
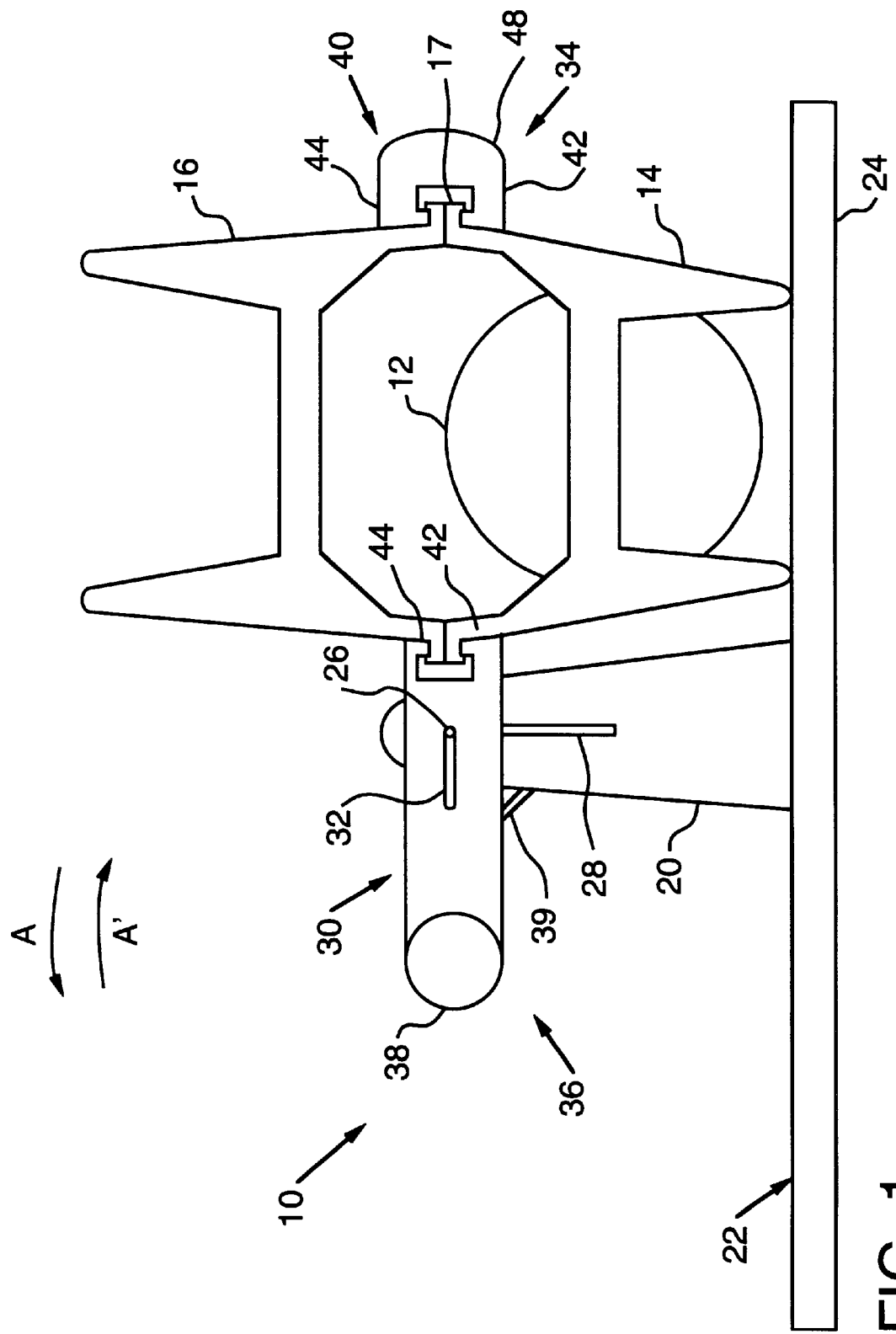
FIG. 1 is a side view of a first embodiment of the present invention having a clamp with cooperative first and second retaining portions clamped to two high profile wafer carriers.

The operation of the apparatus 10 will be described generally with reference to the drawings for the purpose of illustrating the present preferred embodiments of the invention only and not for purposes of limiting the same. As shown in drawings, the apparatus 10 is generally useful for transferring articles 12 between a first partitioned carrier 14 and a second partitioned carrier 16 of similar or differing designs. The first carrier 14 and the second carrier 16, each have edge portions 17 and a plurality of retaining slots 18 defined by partitions 19. The partitioned slots 18 are used to retain the articles 12 in a generally ordered, spaced relationship.

Figure 4:
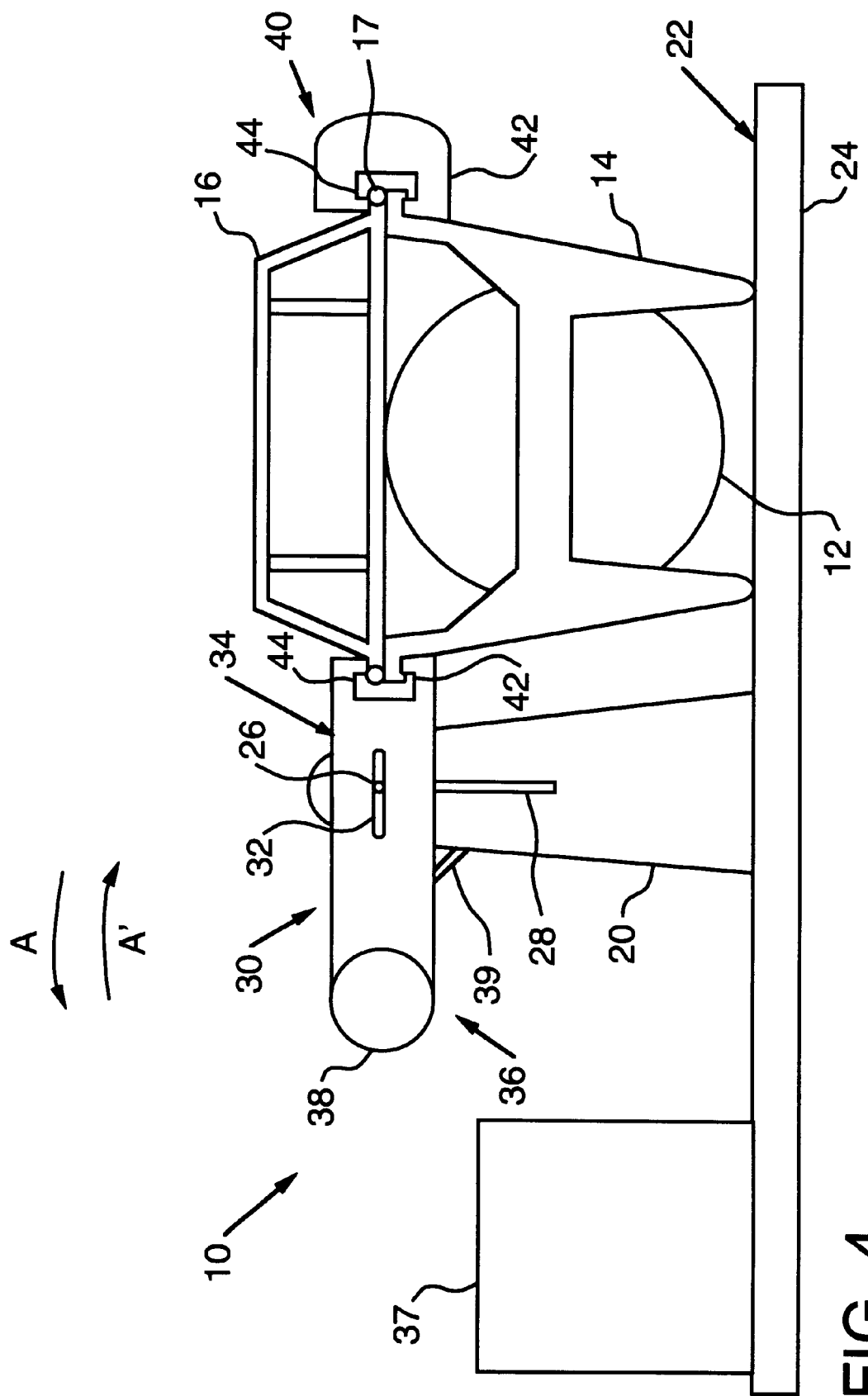
FIG. 4 is a side view of a first embodiment of the present invention having a clamp with cooperative first and second retaining portions clamped to a high profile and a low profile wafer carrier.

In a preferred embodiment, the apparatus 10 is used to transfer circular semiconductor wafers between cassette type wafer carriers. The apparatus 10 can be used with either high or low profile carriers as shown in the drawings. A high profile carrier of the type shown in FIG. 1 as used herein is generally considered to be a carrier having sufficient depth that the articles 12 fit entirely or almost entirely within the carrier, while low profile carriers, an example of which is shown in FIG. 4, are those carriers in which a substantial portion of each article 12 extends beyond the profile of the carrier. The invention is generally applicable to either high or low profile carriers and combinations thereof. The distinction between the types of carriers is presented to facilitate the description of the invention.

The apparatus 10 preferably includes a fulcrum 20 and a lever arm 30. The fulcrum 20 is preferably secured to a surface 22 of a base 24 to impart stability to the apparatus 10. Preferably, the fulcrum 20 should be of sufficient size to provide for the transfer of all wafer sizes of interest. The fulcrum 20 also preferably includes an adjustable mount, or pivot, 26, such as a pin, disposed in a vertical translation slot 28.

Figure 2:
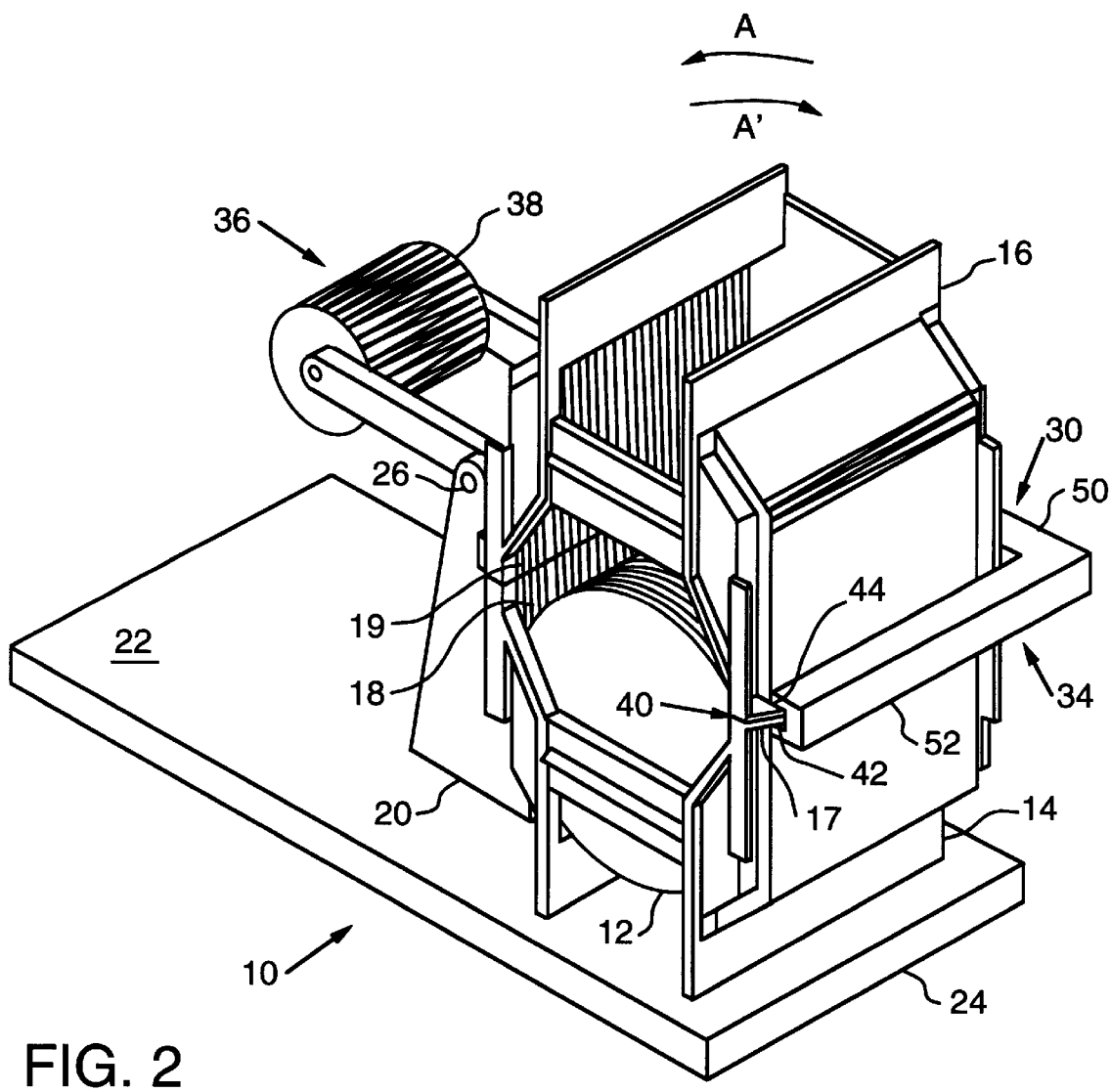
FIG. 2 is a perspective view of a first embodiment of the present invention.
Figure 3:
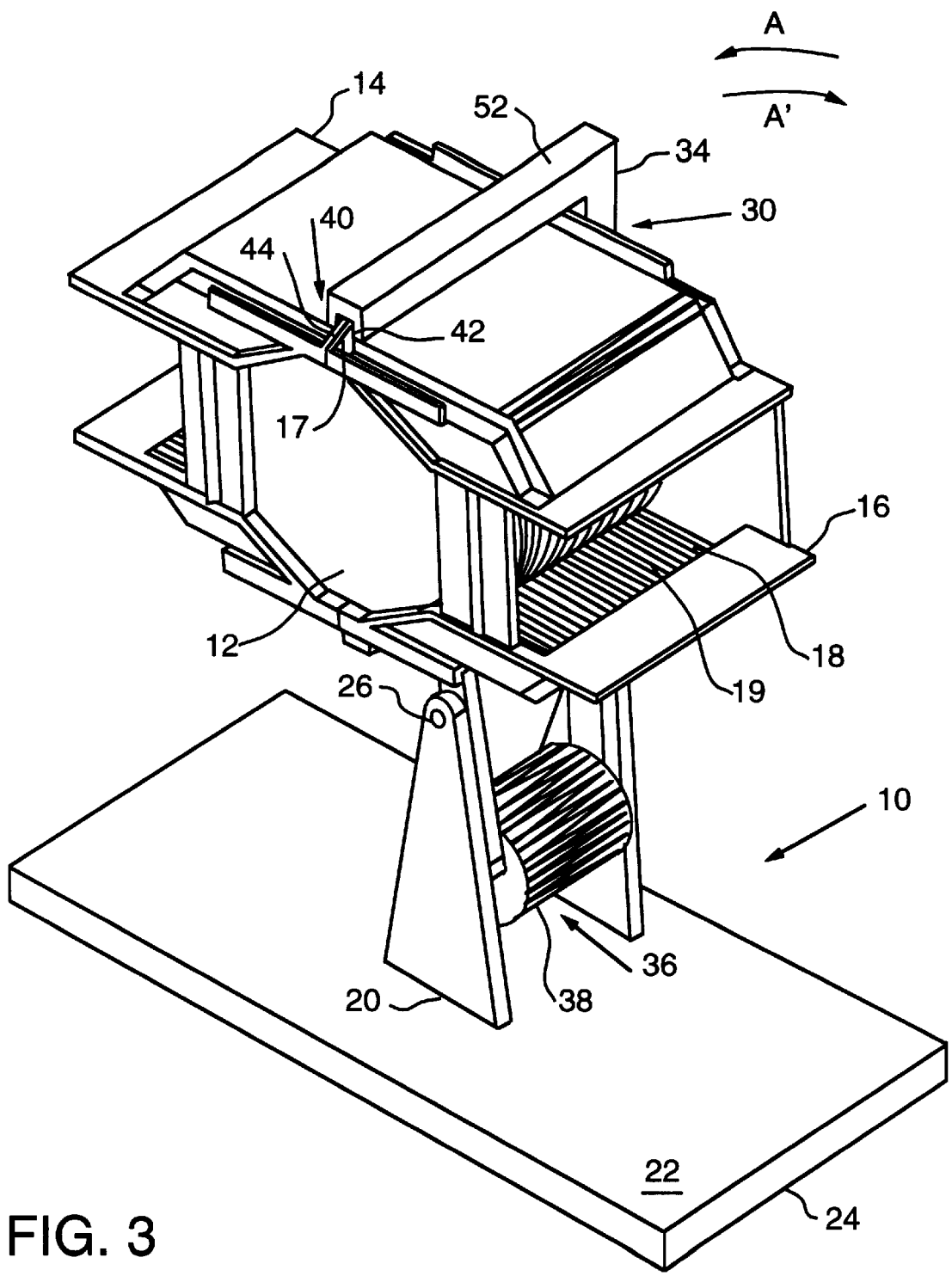
FIG. 3 is a perspective view of the embodiment of FIG. 2 during the rotation of the transfer arm.

As shown in FIG. 1, a lever arm 30 is rotatably attached to the fulcrum 20 to allow rotation around the pivot 26 in the directions shown by arrows A–A'. Preferably, the lever arm 30 is attached to the pivot 26 to allow the lever arm 30 to be vertically adjusted to accommodate different size carriers. It is also preferred that the lever arm 30 include a horizontal translation slot 32 that provides for horizontal translation of the lever arm 30 with respect to the pivot 26 and the fulcrum 20. In this manner, slots 28 and 32 provide for two dimensional control of the position of the lever arm 30. Alternatively, the lever arm 30 can be translatable in other patterns or can be rotatable in a fixed location on the fulcrum 20 as shown in FIGS. 2 and 3.

Preferably, the lever arm 30 is attached to the pivot 26 to define a transfer end 34 and a balance end 36 on respective sides of the pivot attachment. A counterbalancing weight 38 is preferably attached to the balance end 36 of the lever arm 30 to provide for easier rotation of the lever arm 30. In addition, a locking mechanism 39 is provided to fix the position of the lever arm 30 when the distribution of forces are such that a moment is exerted upon the lever arm 30. A primary use of the locking mechanism 39 is to hold the lever arm 30 in a horizontal position during loading and unloading of the carriers. For transfers between low profile and high profile carriers, as shown in FIG. 4, a support 37 can be provided to prevent over-rotation of the lever arm 30.

In practice, the distance between the fulcrum 20 and the transfer end 34 is preferably minimized, while the distance between the fulcrum 20 and the balance end 36 is maximized. In this manner, the counterbalancing weight 38 necessary to apply the force to rotate the lever arm 30 around the fulcrum 20 can be reduced.

Figure 7:
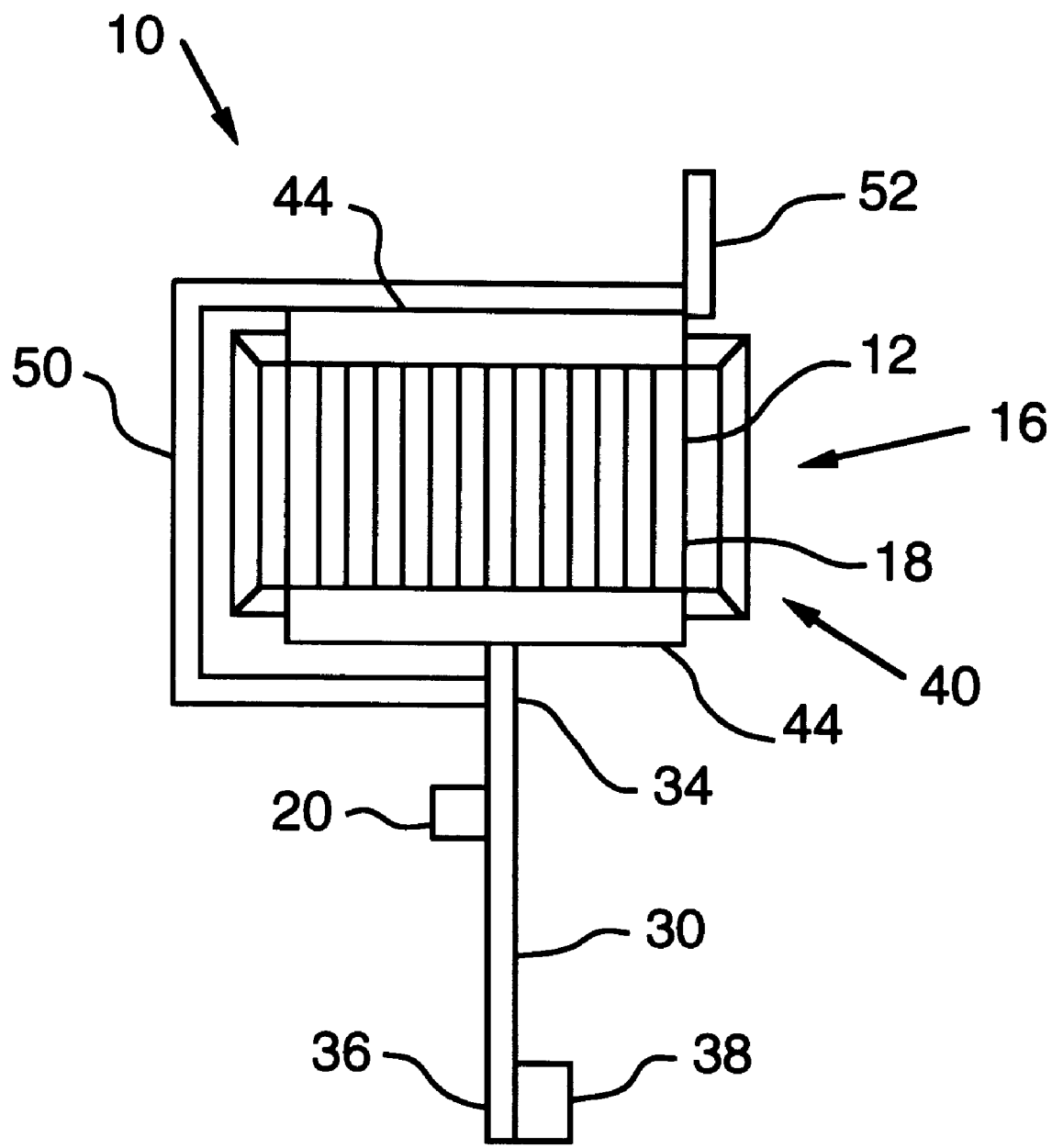
FIG. 7 is a plan view of a first embodiment of the present invention with two opposing clamps connected by a U-shaped member.
Figure 8:
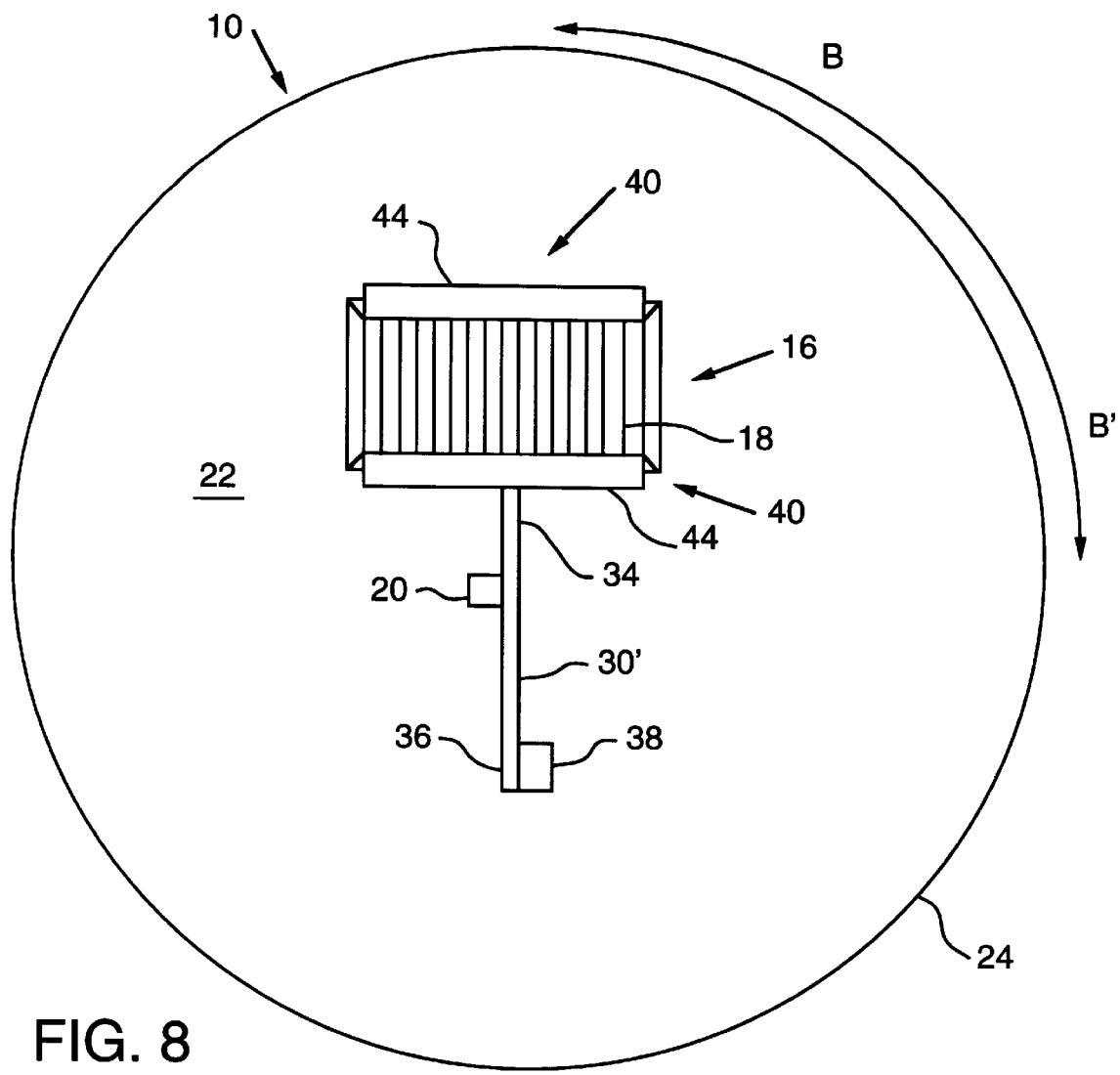
FIG. 8 is a plan view of a first embodiment of the present invention with two opposing independent clamps.

At least one clamp 40 is coupled to the lever arm 30 to secure the carriers, 14 and 16, to the lever arm 30, during the transfer process. Preferably, the clamp 40 is attached to or integrally formed with the transfer end 34 of the lever arm 30, as shown in FIG. 7. Alternatively, the clamp 40 can be used independently of a lever arm 30' to secure the relative orientation and alignment of the first and second carriers, 14 and 16, respectively, as shown in FIG. 8. The carriers can then be separately coupled to the lever arm 30' by conventional methods as is known in the art.

Figure 5:
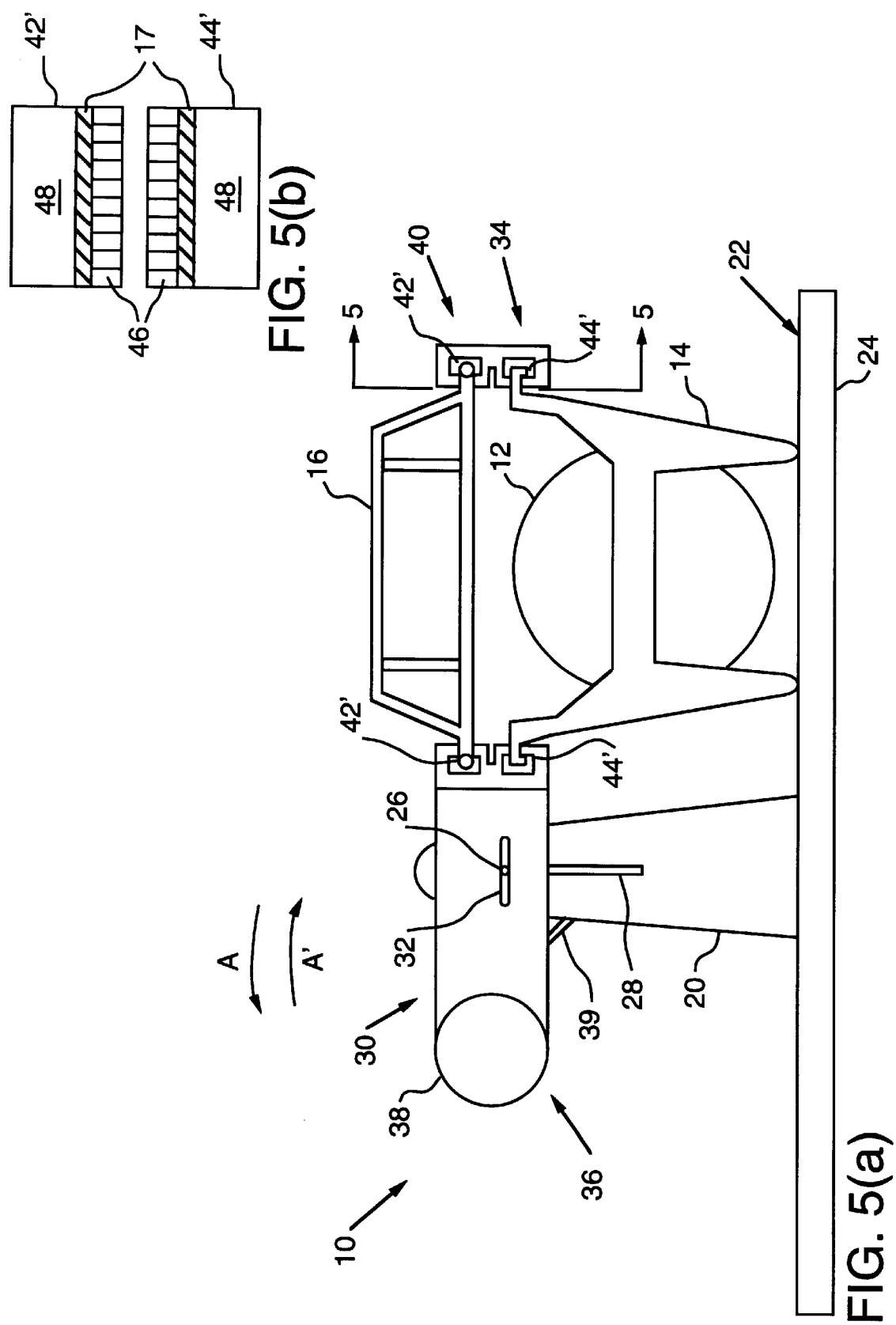
FIGS. 5(a) and (b) are a side view of a first embodiment of the present invention having a clamp with independent first and second retaining portions clamped to a high profile and a low profile wafer carrier and a cross sectional view along line 5—5 of the clamp, respectively.
Figure 6:
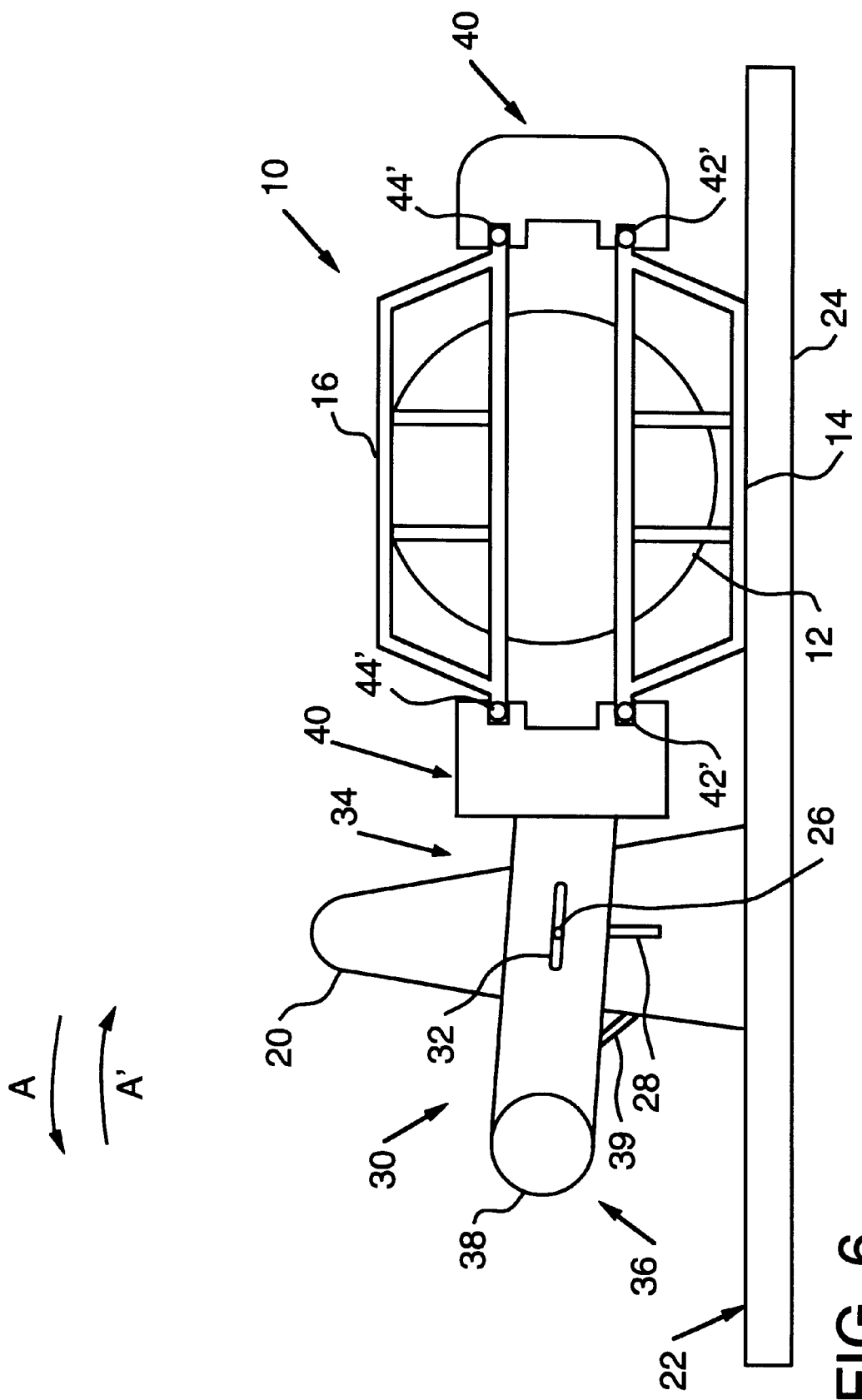
FIG. 6 is a side view of a first embodiment of the present invention having a clamp with independent first and second retaining portions clamped to two low profile wafer carriers.

In a preferred embodiment, two clamps 40 are attached to opposing sides of the carriers to securely retain the carriers during the transfer. In addition, the clamp 40 includes a first carrier retaining portion 42 adjacent to a second carrier retaining portion 44 for retaining the wafer carriers, 14 and 16, respectively, in a generally opposing relationship. The retaining portions, 42 and 44, can be designed to cooperate, as in FIGS. 1 and 2, or to operate independently, shown as 42' and 44' in FIGS. 5 and 6. As further shown in FIG. 5(b), when independently operated retaining portions are employed, the clamps 40 preferably include slots 46 in a face 48 of the retaining portions, 42' and 44', that correspond to the slots 18 in the wafer carriers. The corresponding slots 46 help guide the articles 12 between the carriers during the transfer process.

In a preferred embodiment, as shown in FIG. 7, the lever arm 30 includes a U-shaped member 50 that is connected to the clamps 40 and provides a handle 52 for rotating the lever arm 30 over the fulcrum 20. Alternatively, as shown in FIG. 8, distinct and separate clamps 40 can be employed in the invention.

As further shown in FIG. 8, the base 24 can be rotatable in the plane of the base surface 22 in directions shown by arrows B–B'. The rotatable base 24 allows the user to rotate the apparatus 10 to facilitate the placement, rotation and removal of the carriers.

Figure 9:
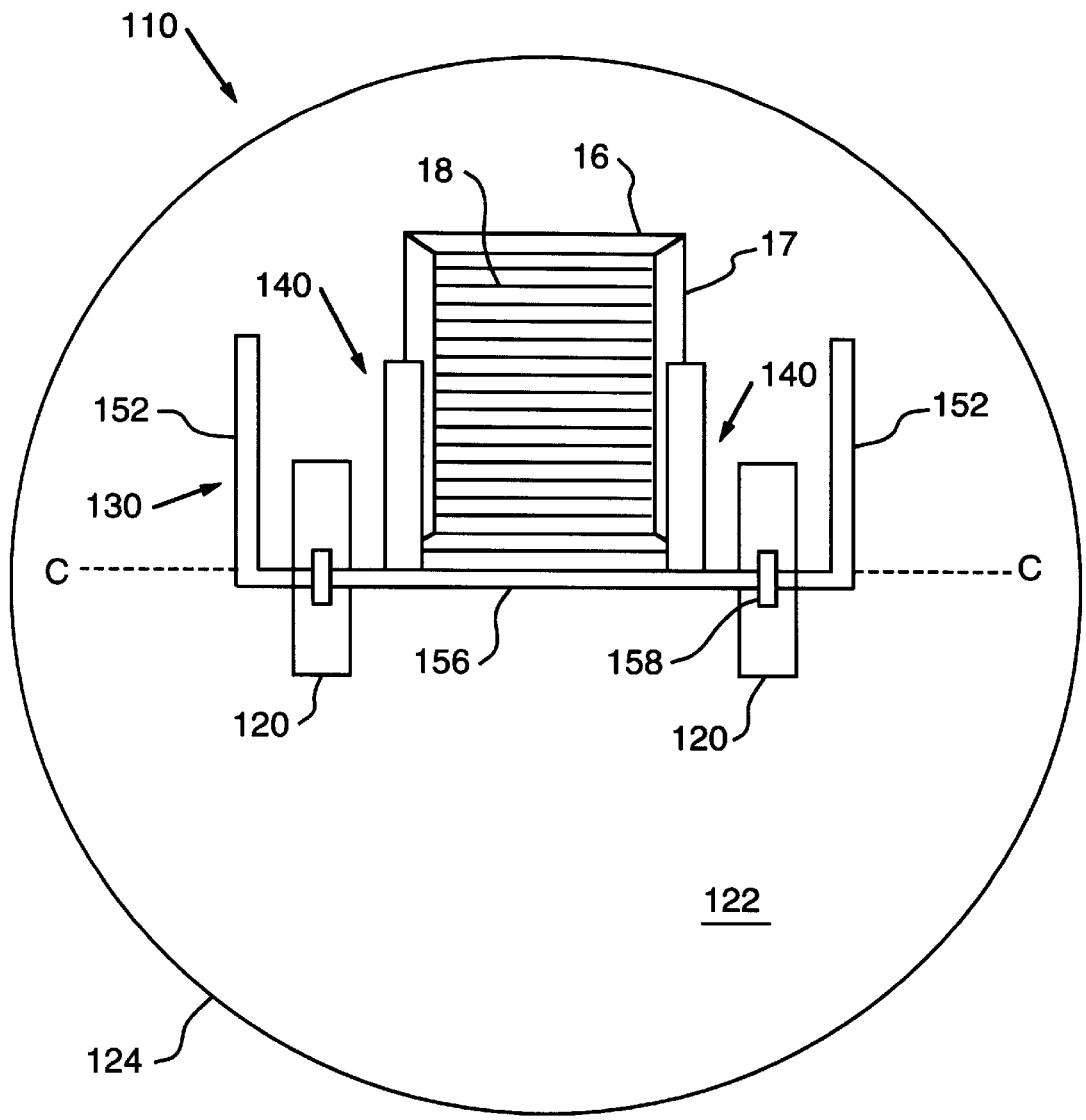
FIG. 9 is a plan view of a second embodiment of the present invention.

A second embodiment of an apparatus 110 is shown in FIG. 9. For convenience, similar or common parts in the various embodiments will be designated using reference numbers that have the same last two digits. The apparatus 110 includes at least two fulcrums 120 positioned on a surface 122 of a rotatable base 124. A lever arm 130 includes an axle 156 that extends between and is rotatably attached to the fulcrums 120 in a conventional manner, such as by rings 158 attached to the fulcrum 120 or by extending through a bore in the fulcrum 120. The portion of the axle 156 extending between the fulcrums 120 defines an axis, C—C, around which the axle 156 is rotated. The lever arm 130 preferably extends beyond the ends of the axle portion 156 and the fulcrums 120 and is bent 90° to the axis C—C to form a handle 152. Preferably, two clamps 140 are attached to the axle portion 156 and serve as a portion of the lever arm 130. Alternatively, the clamps 140 can be attached to or integral with the handle 152 portion of the lever arm 130.

Figure 10:
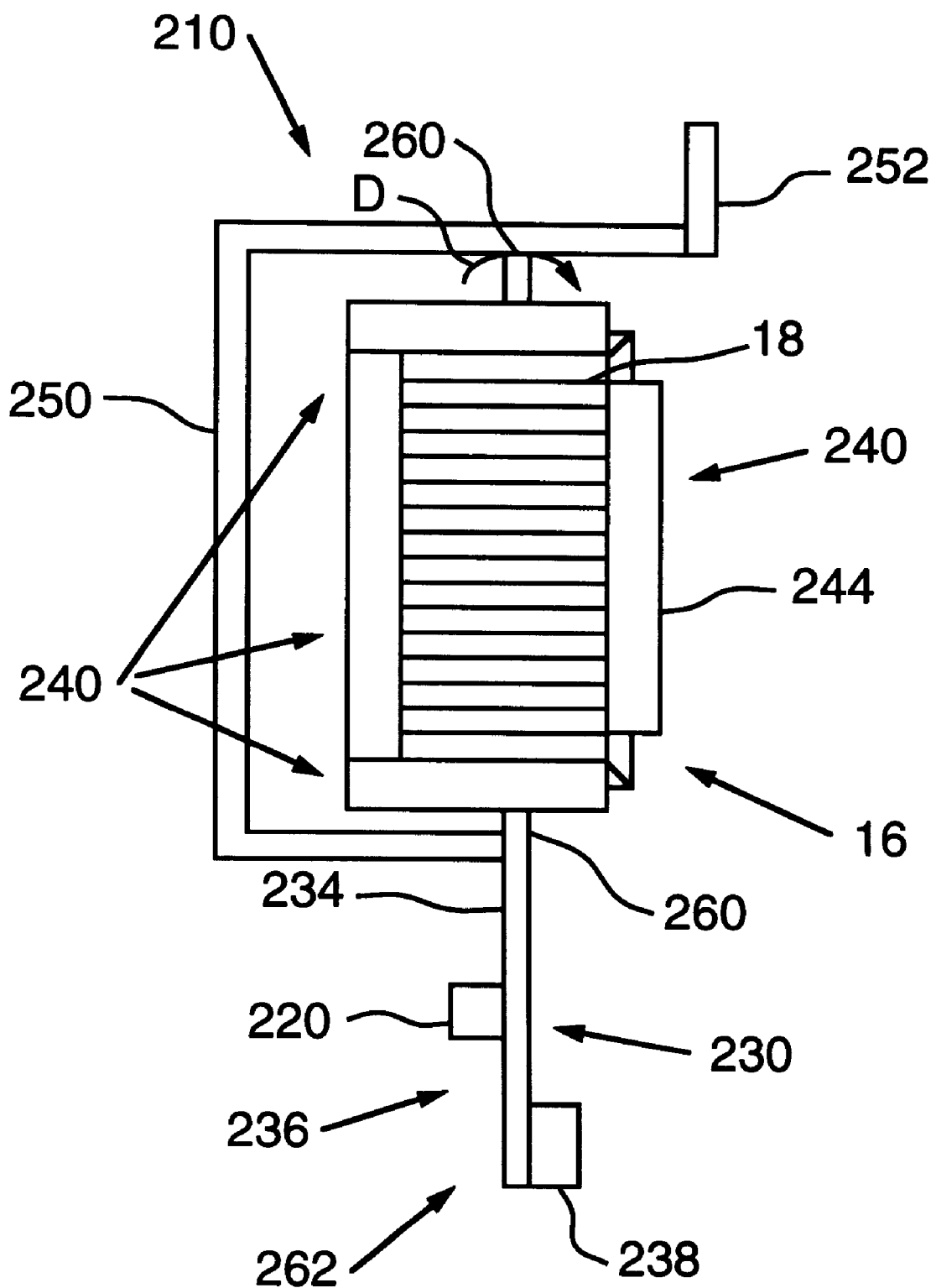
FIG. 10 is a plan view of a third embodiment of the present invention employing a rotating member and a fulcrum and lever arm positioning device.
Figure 11:
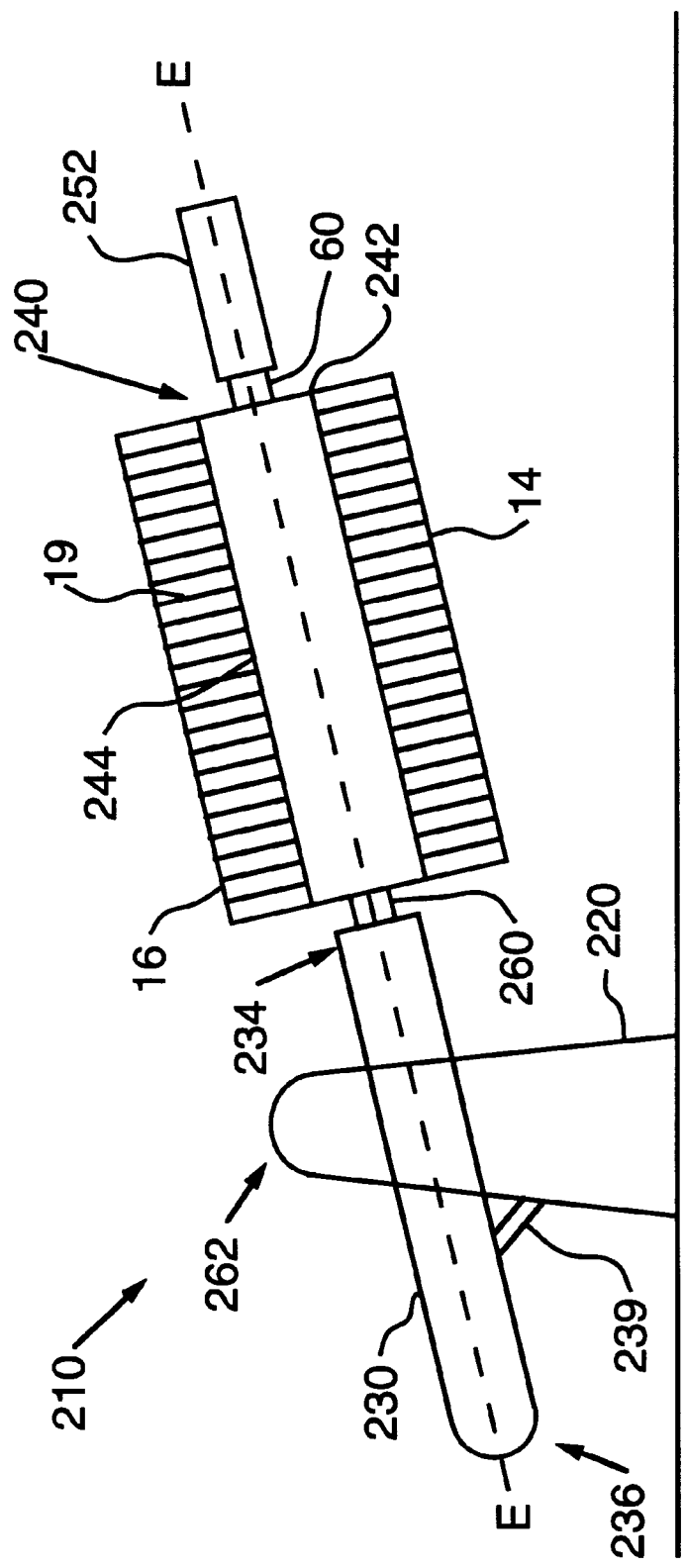
FIG. 11 is a side view of a third embodiment of the present invention employing a rotating member and a fulcrum and lever arm positioning device.

In a third embodiment, shown in FIGS. 10 and 11, an apparatus 210 includes a rotating member 260 that couples at least one clamp 240 to a lever arm 230 via a U-shaped member 250. The lever arm 230 also includes a transfer end 234 and a balance end 236 including a counterbalance weight 238. The wafer carriers, 14 and 16, are held in the clamp 240 by first and second retaining portions, 242 and 244, respectively. The rotating member 260 is provided to allow rotation of carriers that is independent of the rotation of the lever arm 230.

In the embodiments shown in FIGS. 10 and 11, the lever arm 230 and a fulcrum 220 serve as a positioning device 262 and not the actual means for rotating to transfer the articles 12 between the first carrier 14 and the second carrier 16. The positioning device 262 is used to place the rotating member 26C in a transfer position, as shown in FIG. 11, that allows for the rotation of the rotating members 260 and the carriers, 14 and 16, respectively, in a rotational direction D. A locking mechanism 239 can be provided on the lever arm 230 to secure the lever arm 230 in the transfer position during the rotation of the rotating member 260.

Preferably, as shown in FIG. 11, the rotating member 260 is positioned with respect to the clamp 240 and the carriers, 14 and 16, to minimize a radius of rotation in the rotational direction D. The radius of rotation can generally be minimized by establishing a central axis E—E that passes through the centroid of the aligned carriers as shown in FIGS. 11 and 12. In this manner, the distance that the rotating member 260, the clamps 240 and the carriers, 14 and 16, must be moved by the positioning device 262 to the transfer position can be minimized.

The rotation of the carriers is preferably in the plane of the surface of the articles 12, as shown in FIGS. 10 and 11. This orientation is desirable to minimize the potential for abrasion of the surface of the articles on the apparatus. However, the rotation direction can be out of the surface plane, if desired.

A benefit of the embodiment shown in FIGS. 10 and 11 over the embodiments of the apparatus, 10 and 110, respectively, shown in FIGS. 1–8 is that the footprint of the apparatus 210 can be reduced by nearly a factor of two. The reduction is due to the fact that the lever arm 230 does not have to be rotated more than 90° prior to rotating the wafer carriers using the rotating member 260.

Figure 12A:
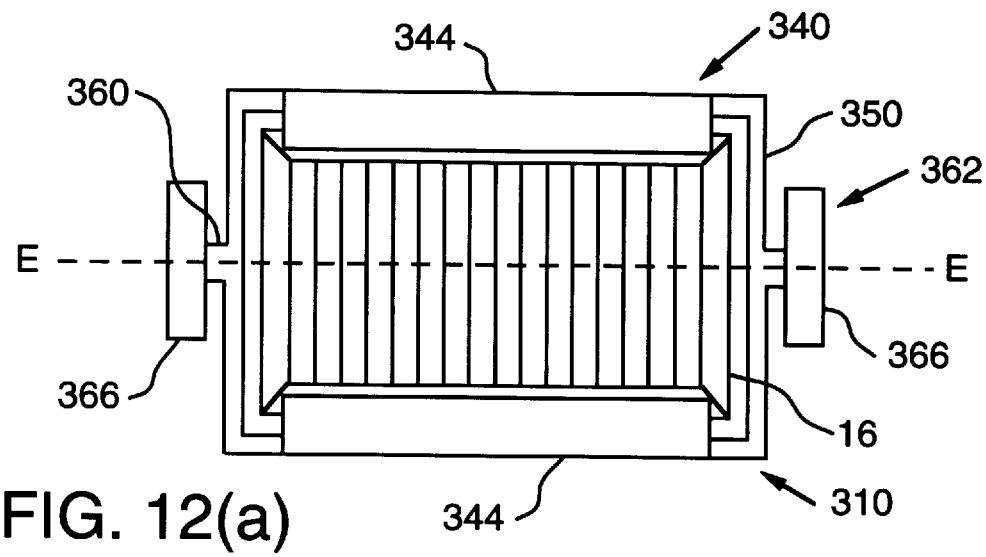
FIG. 12(a) is a plan view of a fourth embodiment of the present invention employing lifts as a positioning device.
Figure 12B:
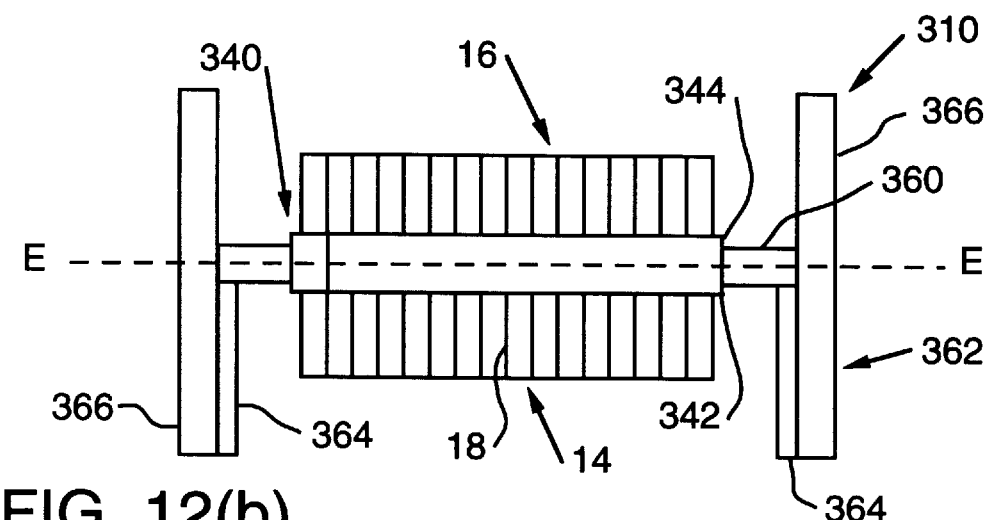
FIGS. 12(b) and (c) are side views of the fourth embodiment with cooperative and independently operative carrier retaining portions, respectively; and, FIGS. 13(a) and (b) are second side views of a fourth embodiment of the present invention employing lifts as a positioning device with cooperative and independently operative carrier retaining portions, respectively.
Figure 12C:
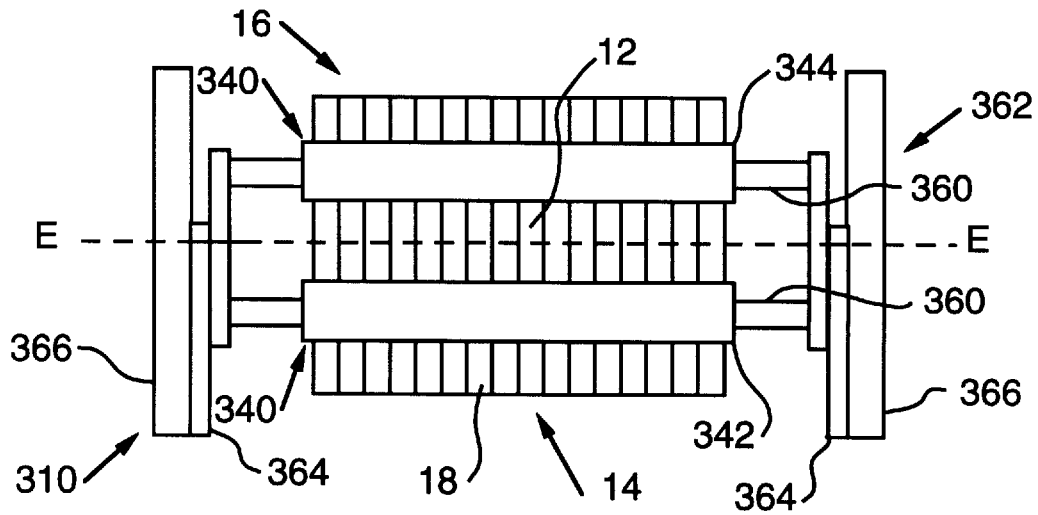
Figure 13B:
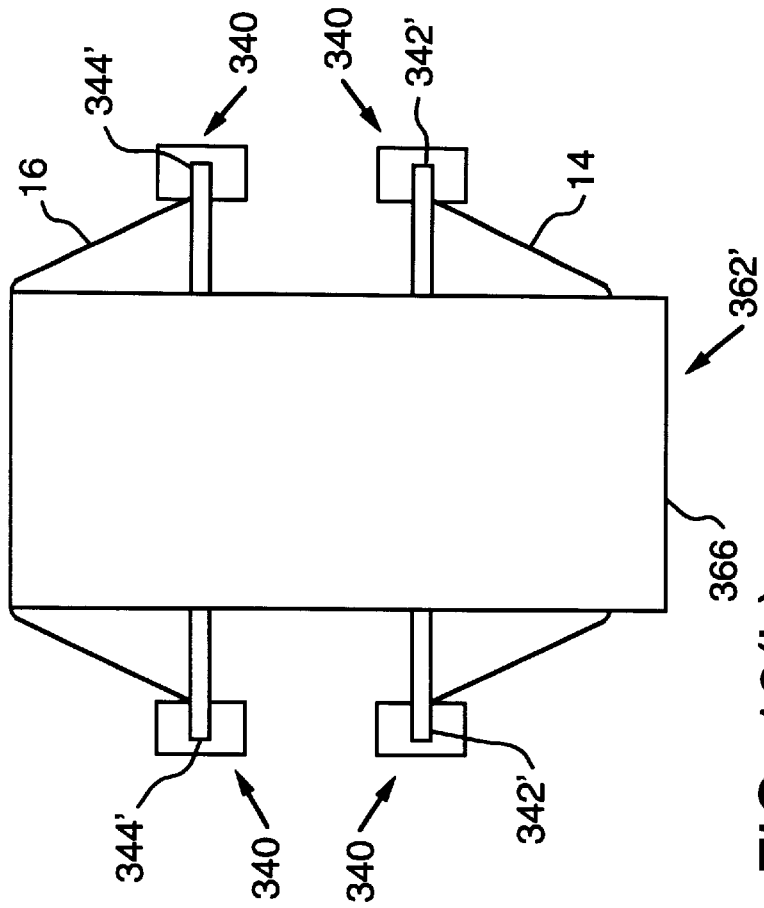
Figure 13A:
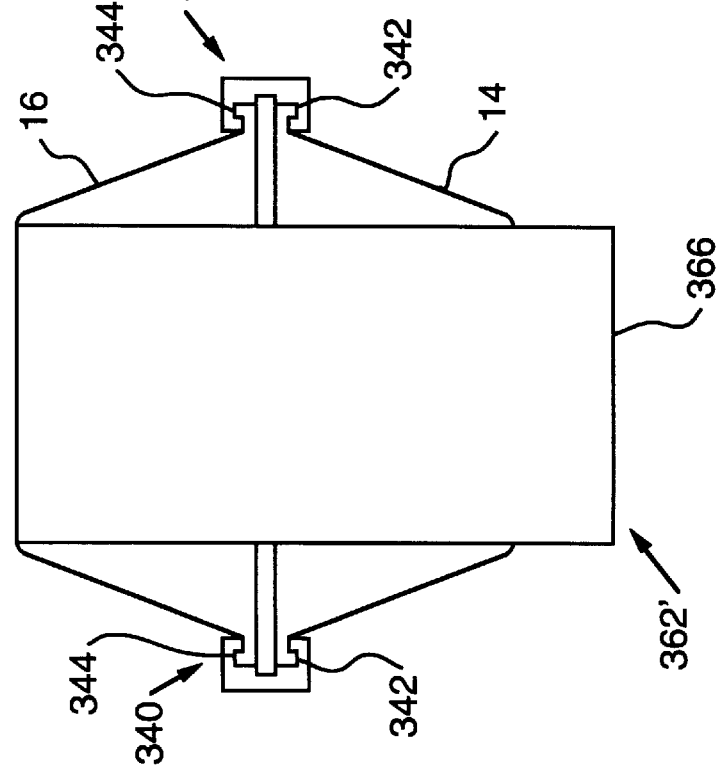

In a fourth embodiment, shown in FIGS. 12 and 13, an apparatus 310 is provided to further reduce the apparatus footprint by employing an alternative positioning device 362. In the fourth embodiment, the positioning device 362 includes a lift 364 that is coupled to provide for translation of a rotating member 360 from a rest position, shown in FIG. 12(b), to a transfer position, shown in FIG. 12(c).

Preferably, as shown in FIG. 12(a), the rotating member 360 is rotatably seated between two lifts 364 and include a U-shaped member 350 coupled to at least one clamp 340. The lifts 364 provides control and uniformity in the translation of the carriers, 14 and 16, held the clamp 340 to and from a transfer position. At the transfer position, the rotating member 360 is preferably rotated around the central axis E—E to bring about the transfer of the articles 12. The two lifts 364 are preferably attached to opposing supports 366 to provide additional stability to the apparatus 310. As shown in FIGS. 12(b–c), the rotating member 360 can be coupled to at least one clamp 340, each having cooperative first and second retaining portions, 342 and 344, respectively, or independently operative first and second carrier retaining portions, 342' and 344', respectively, depending upon whether articles 12 are being transferred between high or low profile carriers.

The rotating member 360 and the carriers, which are secured to rotating member 360 using the clamp 340, are translated in the support 366 using the lift 364 prior to rotation. The lifts 364 can be raised manually or in any conventional automated manner, such as pressurized fluid or mechanical drives. The rotating member 360 is used to rotate the carriers while in the raised position.

The operation of apparatus of the present invention will be further described in terms of the apparatus 10 of the first embodiment as applied to transferring semiconductor wafers, although the principles of operation are generally applicable to other embodiments and applications. The first partitioned carrier 14 containing the wafers is clamped in the first retaining portion 42 of the clamp 40. The second partitioned carrier 16, which is empty, is aligned and clamped using the second retaining portion 44 in a position to receive the wafers from the first carrier 14. The partitions of the second carrier 16 are generally aligned in an opposing relationship with the partitions in the first carrier 14. One skilled in the art will appreciate that a one to one correspondence between the slots as defined by the partitions is not required. Any correspondence that provides for maintaining the ordered separated relationship of the articles is sufficient to practice the invention.

The lever arm 30 is rotated around the fulcrum 20 to move and reorient the wafers in the gravitational field. As the lever arm 30 is rotated, the gravitational field exerts a gravitational force upon the wafers tending to cause the wafers to move from the first carrier 14 to the second carrier 16. In general, the wafers will slide on edge between the carriers before the lever arm 30 is rotated completely around the fulcrum 20. As such, if the carriers are rotated slowly about the plane perpendicular to the direction of the gravitational force, the impact forces experienced by the wafers moving between the carriers during the transfer can be minimized.

The impact force resulting from the rotation will generally be further lessened when the wafer is circularly shaped. The circular shape allows the wafer to roll to some extent between the carriers. Also, when low profile wafer carriers are used in the transfer, the second carrier can be placed in close proximity to or in contact with the wafers prior to the transfer, which will greatly reduce the distance traveled and the impact force generated during the transfer.

As one skilled in the art will recognize, the article transfer machine of the present invention provides a number of advantages over prior art, especially with regard to transferring semiconductor wafers. In particular, the machine can be user with most currently available wafer carriers and for different size wafers. In addition, the machine has a small footprint and does not require extensive maintenance. It can also be appreciated that the carriers can also be rotated in a direction that is not parallel to the edge of the material being transferred.

Although the present invention has been described with specific examples directed to the transfer of semiconductor wafers between cassette type wafer carriers, the method and apparatus may be generally employed to allow the bulk transfer of other articles between carriers. Those of ordinary skill in the art will appreciate the fact that numerous modifications and variations can be made to specific aspects of the method and apparatus of the present invention without departing from the scope of the present invention. Such modifications and variations are intended to be covered by the foregoing specification and the following claims.

What is claimed is:

1. A method of transferring at least one article between two partitioned carriers, said method comprising:

aligning a first partitioned carrier having opposed first and second edge portions, the first partitioned carrier containing at least one article, and a second partitioned carrier having opposed first and second edge portions, such that the partitions of the second carrier are opposed to the partitions of the first carrier;

clamping the aligned first carrier and second carrier to a lever arm which is rotatably supported by a fulcrum, the carriers being supported at a distance from the fulcrum; and rotating the lever arm to move the first and second carriers through a gravitational field to exert a force sufficient to transfer the at least one article from the first carrier directly to the second carrier.

2. The method of claim 1, wherein:

said aligning further comprises providing a first partitioned carrier containing a plurality of ordered articles, and aligning the second partitioned carrier to be oriented to receive and maintain the order of the plurality of articles form the first carrier.

3. The method of claim 1, wherein said clamping the first and second carriers comprises clamping the first carrier in a first retaining portion coupled to the lever arm and the second carrier in a second retaining portion coupled to the lever arm.

4. The method of claim 3, wherein said clamping further comprises clamping the first and second carriers such that the first carrier is in contact with the second carrier.

5. The method of claim 3, wherein said clamping further comprises clamping the first and second carriers such that the first carrier is positionally separated from the second carrier.

6. The method of claim 1, wherein said method comprises a method for transferring at least one semiconductor wafer between the first partitioned carrier and the second partitioned carrier.

7. The method of claim 1, wherein the lever arm includes a transfer end, a balance end, and a rotation axis intermediate the transfer end and the balance end, further comprising attaching a weight to the balance end of the lever arm to act as a counterbalance for the first and second carriers and the at least one article.

8. The method of claim 1, wherein said rotating the lever arm further comprises rotating the lever arm around a fulcrum to transfer the at least one article between the first and second carriers.

9. The method of claim 8, wherein the lever arm includes a carrier retaining end, a counter end, and a rotation point intermediate the carrier retaining end and the counter end, and wherein the fulcrum has an opening, said rotating further comprising passing the counter end of the lever arm through the opening of the fulcrum.

10. The method of claim 1, further comprising resting the first carrier on a stationary base.

11. The method of claim 1, wherein the lever arm rotates around the fulcrum on a pivot axis, further comprising adjusting the location of the pivot axis.

12. The method of claim 11, wherein the lever arm rotates on a pin and said adjusting further comprises sliding the pin in a slot in the fulcrum.

13. The method of claim 11, wherein the lever arm rotates on a pin and said adjusting further comprises sliding the pin in a slot in the lever arm.

14. The method of claim 1, further comprising locking the lever arm to fix the position of the lever arm.

15. The method of claim 1, wherein said clamping further comprises:

clamping the first carrier to the second carrier; and coupling the first and second carriers to the lever arm.

16. A method of transferring at least one article between two carriers, said method comprising:

aligning a first partitioned carrier having opposed first and second edge portions, the first partitioned carrier containing at least one article, and a second partitioned carrier having opposed first and second edge portions, such that the partitions of the second carrier are opposed to the partitions of the first carrier;

positioning the aligned first and second carriers in a transfer position to provide for the rotation of the first and second carriers through a gravitational field;

clamping the aligned first carrier and second carrier to a lever arm which is rotatably supported by a fulcrum, the carriers being supported at a distance from the fulcrum; and rotating the lever arm around the fulcrum to move the first and second carrier through said gravitational field to exert a force sufficient to transfer the at least one article contained in the first carrier directly to the second carrier.

17. The method of claim 16, wherein said rotating further comprises rotating the first and second carriers about an axis to minimize a radius of rotation defined by the rotation of the carriers.

18. The method of claim 16, wherein said rotating the first and second carriers further comprises rotating the carriers in a rotation direction that is parallel to a surface of the article.

19. The method of claim 16, wherein said method comprises a method for transferring at least one semiconductor wafer between the first carrier and the second carrier.

* * * * *

UNITED STATES PATENT AND TRADEMARK OFFICE
CERTIFICATE OF CORRECTION

PATENT NO. : 5,993,148

DATED : November 30, 1999

INVENTOR(S) : Paul D. Brown

It is certified that error appears in the above-identified patent and that said Letters Patent is hereby corrected as shown below:

Column 6, line 8, delete "26C" and insert --260--.

Signed and Sealed this

Tenth Day of April, 2001

Attest:

NICHOLAS P. GODICI

Attesting Officer    Acting Director of the United States Patent and Trademark Office